(12) United States Patent
Chen

(10) Patent No.: US 6,775,134 B2
(45) Date of Patent: Aug. 10, 2004

(54) HEAT DISSIPATION SYSTEM

(75) Inventor: Yun Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/327,161

(22) Filed: Dec. 20, 2002

(65) Prior Publication Data
US 2004/0037037 A1 Feb. 26, 2004

(30) Foreign Application Priority Data
Aug. 20, 2002 (TW) .......................................... 91212916

(51) Int. Cl.[7] .............................................. H05K 7/20
(52) U.S. Cl. ........................ 361/687; 361/695; 361/688; 165/122; 454/184
(58) Field of Search ................................ 361/683, 686, 361/687, 688, 689, 690, 692, 695; 165/80.2, 80.3, 165, 185, 122, 121; 454/184

(56) References Cited
U.S. PATENT DOCUMENTS 5,361,188 A * 11/1994 Kondou et al. ............. 361/695
5,402,312 A * 3/1995 Kinjo et al. ................. 361/695
5,793,608 A * 8/1998 Winick et al. .............. 361/695
6,356,435 B1 * 3/2002 Davis et al. ................. 361/678
6,512,673 B1 * 1/2003 Wiley ......................... 361/695
6,525,936 B2 * 2/2003 Beitelmal et al. ........... 361/695

* cited by examiner

Primary Examiner—Michael Datskovsky
(74) Attorney, Agent, or Firm—Wei Te Chung

(57) ABSTRACT

A heat dissipation system includes an enclosure (10), a motherboard (30), a CPU module, a plurality of first system fan (80) and a second fan (90). The enclosure includes a first panel (12), a second panel (14) perpendicular to the first panel and a third panel (16) parallel to the first panel. A plurality of air inlets (18) is defined in the third panel. The motherboard is mounted inside the enclosure parallel to but opposite from the second panel. The CPU module is secured to the motherboard. The first fan is secured to the first panel for expelling air inside the enclosure to an outside of the enclosure. The second fan is secured to the second panel for causing air entering the enclosure via the air inlets to be directed generally toward the CPU module.

15 Claims, 3 Drawing Sheets

HEAT DISSIPATION SYSTEM

BACKGROUND OF THE INVENTION

1. Field of the Invention

The present invention relates to heat dissipation systems for electronic equipment, and more particularly to a heat dissipation system for removal of heat from an electronic package such as a central processing unit (CPU) in a computer enclosure.

2. Description of Prior Art

Modern high-speed CPUs generate copious amounts of heat during operation. The heat must be efficiently removed from the CPU; otherwise, abnormal operation or damage may result. Typically, a heat sink is attached on the CPU, and a fan is mounted on the heat sink to enhance the efficiency of heat removal.

Many modern heat sinks and fans are very large, to give them the heat dissipation capability needed to properly maintain high-speed CPUs. These heat sinks and fans are correspondingly heavy and bulky. When a heavy heat sink is attached on a CPU that is mounted on a motherboard, the sheer weight of the heat sink can place excessive load on the motherboard. The motherboard is prone to be deflected or distorted. When this happens, mechanical and electrical connection between the CPU and the motherboard may be impaired or even lost altogether. These problems are compounded when a fan is mounted on the heat sink. In addition, bulky heat sinks and fans take up valuable space inside a computer enclosure. This militates against the modern trend toward miniaturization of computers.

FIG. 4 shows a heat dissipation system which helps reduce the need for excessively large heat sinks and accompanying fans. A system fan 800 is mounted in a first panel of a computer enclosure. A heat sink 520 is attached to a CPU that is mounted near a second panel of the enclosure that is orthogonal to the panel having the system fan 800. The system fan 800 is utilized in place of any fan that would otherwise be mounted on the heat sink 520. Air inlets are defined in a third panel of the enclosure that is parallel to but opposite from the first panel. The system fan 800 provides motive force for airflow through the enclosure and air exchange inside the enclosure. However, airflow 200 entering the enclosure from the air inlets tends to travel directly toward the system fan 800. Air exchange in the vicinity of the heat sink 520 is limited. The efficiency of heat removal of this heat dissipation system is unsatisfactory.

SUMMARY OF THE INVENTION

Accordingly, an object of the present invention is to provide a heat dissipation system for an electronic package which has great heat dissipation capability without relying on a heavy or bulky heat sink.

In order to achieve the object set out above, a heat dissipation system in accordance with a preferred embodiment of the present invention includes an enclosure, a motherboard, a CPU module, a plurality of first system fans and a second fan. The enclosure includes a first panel, a second panel perpendicular to the first panel and a third panel parallel to the first panel. A plurality of air inlets is defined in the third panel. The motherboard is mounted inside the enclosure parallel to but opposite from the second panel. The CPU module is secured to the motherboard. The first fan is secured to the first panel for expelling air inside the enclosure to an outside of the enclosure. The second fan is secured to the second panel for causing air entering the enclosure via the air inlets to be directed generally toward the CPU module.

Other objects, advantages and novel features of the present invention will become more apparent from the following detailed description when taken in conjunction with the accompanying drawings, in which:

DETAILED DESCRIPTION OF THE INVENTION

Figure 1:
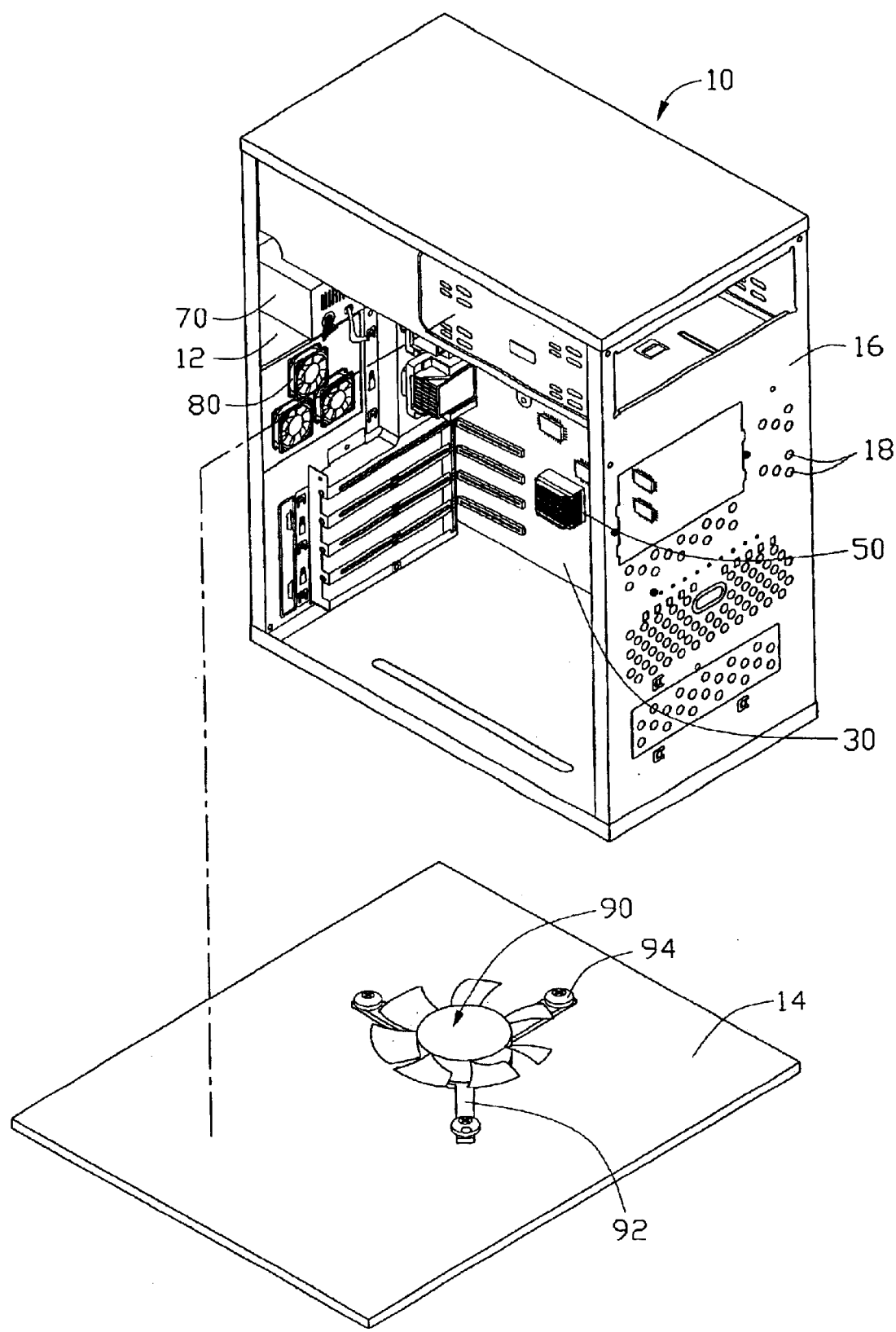
FIG. 1 is an exploded isometric view of a heat dissipation system in accordance with a preferred embodiment of the present invention.

Referring to FIG. 1, a heat dissipation system in accordance with a preferred embodiment of the present invention comprises an enclosure 10, a motherboard 30, a CPU module 50, a power supply 70, a plurality of first system fans 80 and a second fan 90.

The enclosure 10 is substantially parallelepiped and longitudinally comprises a rear first panel 12, a side second panel 14 and a front third panel 16. The first and third panels 12, 16 are parallel to each other, and perpendicular to the second panel 14. The motherboard 30 is mounted inside the enclosure 10 parallel to but opposite from the second panel 14. The CPU module 50 comprises a heat sink 52 (see FIG. 3), a CPU (not shown) and an electrical connector (not shown). The connector is mounted on the motherboard 30, and the CPU is mounted on the connector. The heat sink 52 is attached to the CPU by conventional means.

Figure 2:
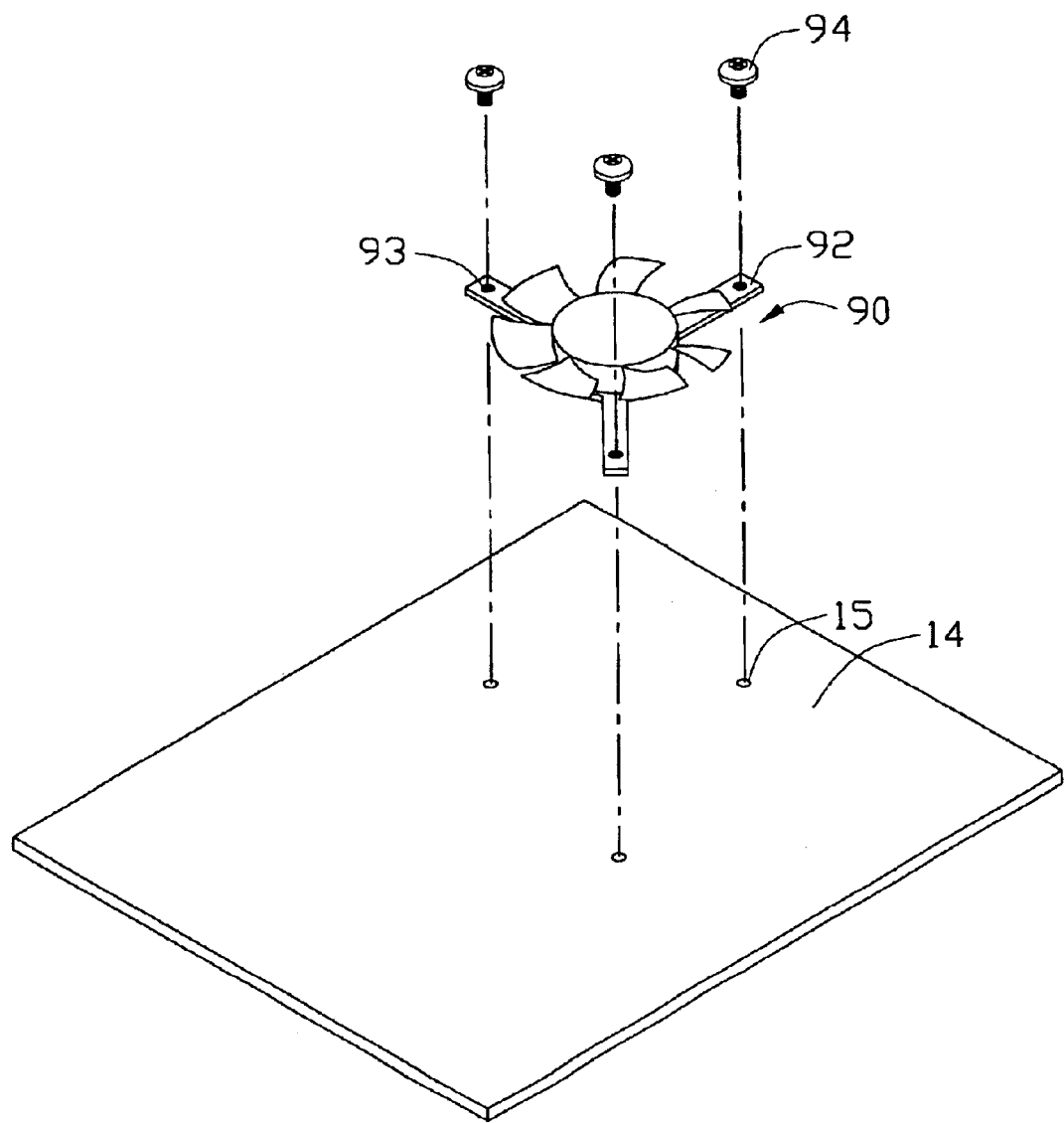
FIG. 2 is an exploded isometric view of a panel and a fan of the heat dissipation system of FIG. 1.

The power supply 70 and the system fans 80 are mounted on an inside of the first panel 12. Referring to also to FIG. 2, the second fan 90 is secured to an inside of the second panel 14, aligned with the CPU module 50. The second fan 90 comprises a flat three-legged base 92. Three bores 93 are defined in respective ends of the legs of the base 92. The second panel 14 defines three fastening holes 15 corresponding the bores 93. Screws 94 are inserted through the bores 93 and engaged in the fastening holes 15, thus securing the second fan 90 to the second panel 14. A plurality of air inlets 18 is defined in the third panel 16.

In operation, the heat sink 52 dissipates heat generated from the CPU to ambient air, thus heating the ambient air. Cooling air enters the enclosure 10 via the air inlets 18 of the third panel 16. The second fan 90 causes the cooling air to be mixed with the hot ambient air in the enclosure 10. Then the mixed air exits the enclosure 10 via the system fans 80. Thus the heat sink 52 is cooled, allowing the heat generated from the CPU to be efficiently removed.

Figure 3:
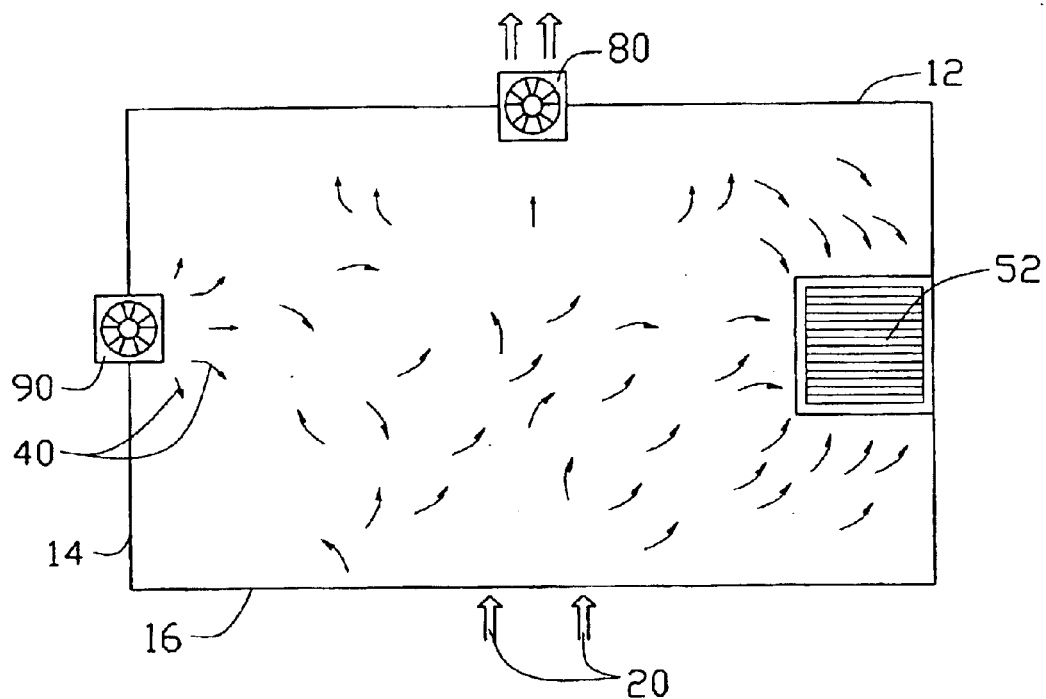
FIG. 3 is a schematic top plan view of the enclosure of FIG. 1, showing airflow during operation of the heat dissipation system of FIG. 1.
Figure 4:
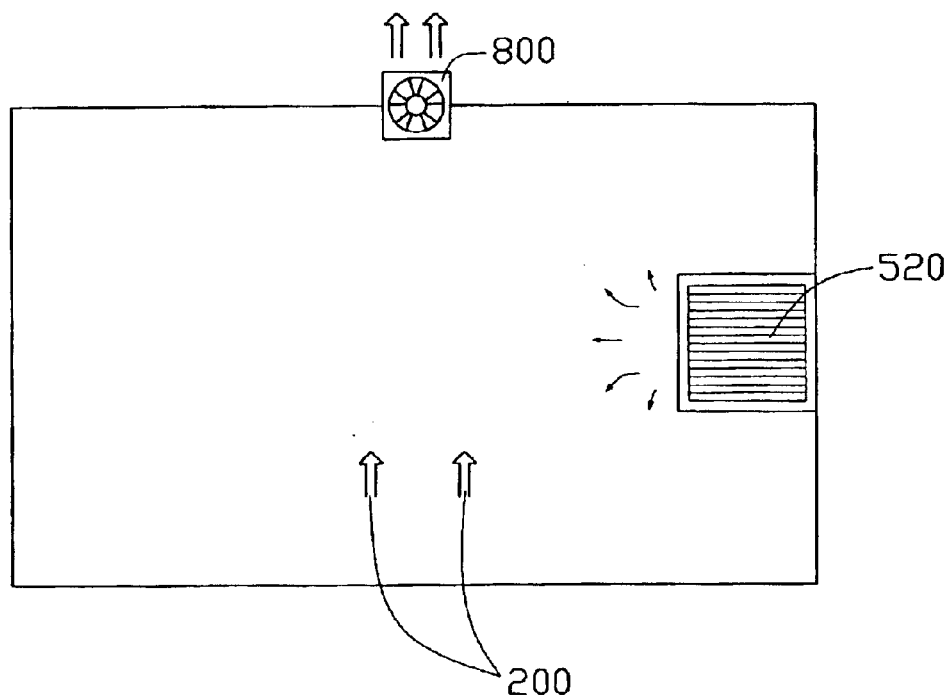
FIG. 4 is a schematic top plan view of a conventional enclosure, showing airflow during operation of a conventional heat dissipation system.

FIG. 3 shows cooling airflow 20 entering the enclosure 10 via the air inlets 18 (not shown) in a direction toward the system fans 80 (only one shown). The second fan 90 generates airflow 40 that directs the cooling airflow 20 generally toward the heat sink 52, so that the cooling airflow 20 mixes with hot air dissipated from the heat sink 52. Then the mixed air exits the enclosure 10 via the system fans 80. Thus, a temperature of ambient air around the heat sink 52 is decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation system comprising:
   an enclosure comprising a first panel, a second panel perpendicular to the first panel, and a third panel parallel to and opposite from the first panel, a plurality of air inlets being defined in the third panel;
   a circuit board secured in the enclosure opposite from the second panel;
   an electronic package secured to the circuit board;
   a first fan secured to the first panel for expelling air inside the enclosure to an outside of the enclosure; and
   a second fan secured to the second panel and aligned with the electronic package, for causing air entering the enclosure via the air inlets to be directed generally toward the electronic package, the second fan comprising a flat base having a plurality of legs.

2. The heat dissipation system of claim 1, wherein the first fan is a system fan.

3. The heat dissipation system of claim 1, wherein a plurality of bores is defined in the base of the second fan.

4. The heat dissipation system of claim 3, wherein a plurality of fastening holes is defined in the second panel, corresponding to the bores.

5. The heat dissipation system of claim 4, wherein a plurality of fasteners extends through the bores and is engaged in the fastening holes, thereby securing the second fan to the second panel.

6. The heat dissipation system of claim 1, further comprising a heat sink attached to the electronic package.

7. A heat dissipation system comprising:
   an enclosure defining a space therein;
   a heat generating device located at a position in said space;
   a first fan positioned on the enclosure and facing said space in a first direction and communicating with an exterior;
   a second fan positioned on an inside of the enclosure without direct communication with the exterior and facing said space and spatially directing to said heat generating device a second direction different from said first direction; and
   a plurality of inlets located in the enclosure to allow a cool air from the exterior into the space; wherein
   the cool air entering the space is forced by the second fan toward the heat generating device; wherein
   said second heat generating device are substantially located on two sides of said space.

8. The system of claim 7, wherein said first fan is to expel air in the space to the exterior.

9. The system of claim 8, wherein said inlets are opposite to said first fan in said first direction.

10. The system of claim 7, wherein said first direction and said second direction are perpendicular to each other.

11. The system of claim 7, wherein said enclosure defines a rectangular parallelpiped with thereof a long axis and a short axis perpendicular to each other, said long axis being in said first direction and said short axis being in said second direction.

12. A method of removing hot air from an computer enclosure, comprising steps of:
   providing the enclosure with opposite first and second sides and a third side located between said first and second sides;
   providing a space in said enclosure and surrounded by said first, second and third sides;
   providing a heat generating in the space;
   providing a first fan for communicating air between the space and an exterior outside the enclosure;
   providing a second fan for forcible circulation of air in said space; wherein
   said second fan is spaced from said heat generating device with a distance for enhancement of said circulation in the whole space; further including a step of providing inlets in the second side to allow cool air from the exterior into the space; wherein
   said first side and said second side commonly define a long axis of said enclosure while said second fan and said heat generating device commonly define a short axis of said enclosure, under a condition that said second fan and said heat generating device are respectively located by two sides of said space.

13. The method of claim 12, wherein said second fan is located on an inside of the side and facing the heating generating device.

14. The method of claim 12, wherein said first fan is located in the first side.

15. The method of claim 13, wherein said second fan does not directly communicate with the exterior but shielded by the third side.

* * * * *